(12) United States Patent
Wang et al.

(10) Patent No.: US 10,819,361 B2
(45) Date of Patent: Oct. 27, 2020

(54) CAPACITOR STRUCTURE WITH CORRELATED ERROR MITIGATION AND IMPROVED SYSTEMATIC MISMATCH IN TECHNOLOGIES WITH MULTIPLE PATTERNING

(71) Applicant: Apple Inc., Cupertino, CA (US)

(72) Inventors: Tao Wang, Cupertino, CA (US); Mansour Keramat, Los Gatos, CA (US); Yi Chun A. Fu, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/745,173

(22) Filed: Jan. 16, 2020

(65) Prior Publication Data

US 2020/0153448 A1 May 14, 2020

Related U.S. Application Data

(63) Continuation of application No. 15/969,547, filed on May 2, 2018, now Pat. No. 10,574,249.

(51) Int. Cl.
*H03M 1/10* (2006.01)
*H01L 23/528* (2006.01)
*H01L 27/10* (2006.01)

(52) U.S. Cl.
CPC ........ *H03M 1/1033* (2013.01); *H01L 23/528* (2013.01); *H01L 27/101* (2013.01)

(58) Field of Classification Search
CPC .... H03M 1/1033; H03M 1/804; H03M 1/468; H01L 23/528; H01L 27/101; H01L 23/5223
USPC ......................................... 341/155, 120, 172
See application file for complete search history.

(56) References Cited

U.S. PATENT DOCUMENTS

| | | | |
|---|---|---|---|
| 7,394,416 B2 | 7/2008 | Komatsu et al. | |
| 8,223,044 B2* | 7/2012 | Snedeker ............ | H03M 1/1047 341/118 |
| 8,649,157 B2 | 2/2014 | Letual et al. | |
| 9,654,131 B1 | 5/2017 | Fuchs et al. | |
| 9,654,135 B2* | 5/2017 | Miki .................. | H03M 1/0626 |
| 10,135,457 B2* | 11/2018 | Chang ................ | H03M 1/0682 |
| 10,270,459 B2* | 4/2019 | Fan ...................... | H03M 1/002 |
| 2012/0119326 A1 | 5/2012 | Sugisaki et al. | |
| 2016/0308546 A1 | 10/2016 | Chandra et al. | |

* cited by examiner

*Primary Examiner* — Brian K Young
(74) *Attorney, Agent, or Firm* — Jaffery Watson Mendonsa & Hamilton LLP

(57) ABSTRACT

Capacitor arrays and methods of operating a digital to analog converter are described. In an embodiment, a capacitor array includes a unit capacitor (Cu) structure characterized by a unit capacitance value, a plurality of different super-unit capacitor structures, and a plurality of different sub-unit capacitor structures, each different sub-unit capacitor structure having a different capacitance defined by a division of the unit capacitance value.

15 Claims, 7 Drawing Sheets

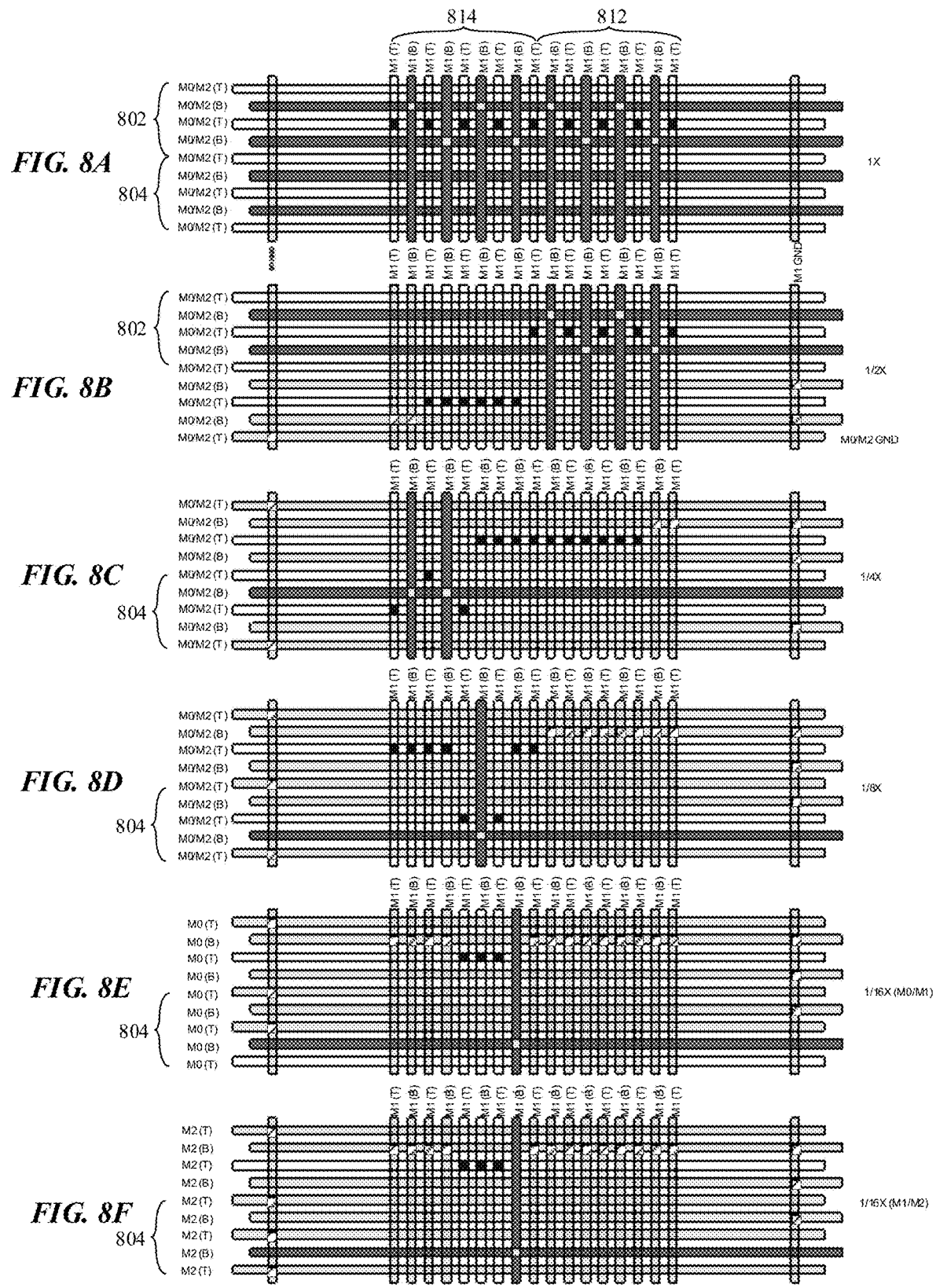

CAPACITOR STRUCTURE WITH CORRELATED ERROR MITIGATION AND IMPROVED SYSTEMATIC MISMATCH IN TECHNOLOGIES WITH MULTIPLE PATTERNING

RELATED APPLICATIONS

This application is a continuation of co-pending U.S. patent application Ser. No. 15/969,547 filed on May 2, 2018, which is incorporated herein by reference.

BACKGROUND

Field

Embodiments described herein relate to capacitors used in semiconductor devices. More particularly, embodiments described herein are related to capacitors within a digital to analog converter.

Background Information

Capacitive arrays such as capacitor digital to analog converters (DACs) have been extensively used in power efficient medium-to-high accuracy applications, due to the natures of charge domain operation and relatively good matching. The capacitive array often occupies a good portion of silicon area and its size directly impacts circuit performances such as power, area, and speed. Conventionally large capacitive arrays are needed to improve matching accuracy for the lowest significant bit (LSB) capacitors. Conversely, a small capacitive array size usually indicates small spacing between capacitor terminals used to form the capacitor and worse matching.

SUMMARY

Capacitor arrays and methods of operating a digital to analog converter are described. The capacitor arrays in accordance with embodiments may include sub-unit capacitor structures in which secondary effect capacitors are taken into consideration to achieve fractional matching of a unit capacitor structure. Furthermore, sets of non-overlapped different locations in a unit capacitor are chosen to form the set of fractional capacitor values. Differential nonlinearity (DNL) error from the transition from a sum of all fractional capacitor values to a unit capacitor value can be minimized utilizing such a configuration.

BRIEF DESCRIPTION OF THE DRAWINGS

FIGS. 8A-8F are schematic top view illustrations of metal layers within a unit capacitor structure and fractional sub-unit capacitor structures in accordance with embodiments.

DETAILED DESCRIPTION

Figure 1:
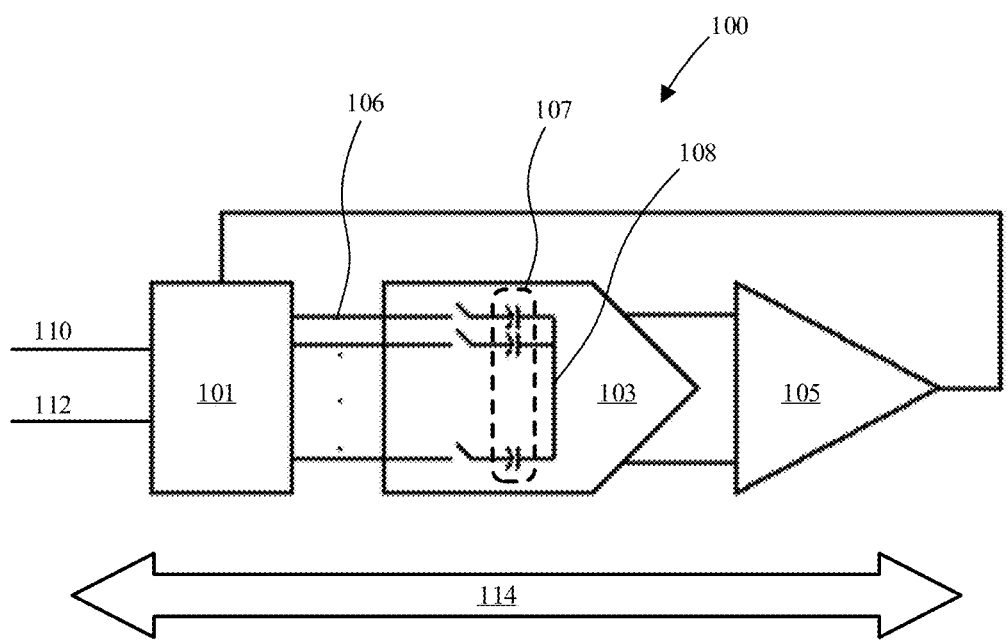
FIG. 1 is a block diagram of an analog-to-digital converter (ADC) in accordance with an embodiment.

Embodiments describe capacitor arrays and methods of operating a digital to analog converter. In particular, embodiments describe capacitor arrays in which capacitance values are obtained with a combination of primary intra-layer capacitors formed by parallel metal lines and secondary effect capacitors. Furthermore, the capacitors are designed in such a way that differential non-linearity (DNL) of the array from correlated errors is mitigated.

In one aspect, it has been observed that with technology nodes including multiple patterning, systematic mismatch between capacitors in the array can show up easily, since the metal lines in the same metal layer are fabricated in multiple phases where in-between phase misalignment may happen. Metal-on-metal (MOM) capacitor structures in accordance with embodiments may be compatible with technology nodes featuring multiple patterning. The capacitors in the array have been designed in a way that differential non-linearity (DNL) of the array from correlated errors have been greatly mitigated. A set of capacitors with fractional values of that of a unit capacitor are made for area efficiency of the array. Systematic mismatch (due to second-order effects) between the unit capacitor and such set of capacitors with fractional values are carefully examined. The array is formed by aligning the capacitors in one direction, without extra routing overhead, compared to conventional arrays.

In an embodiment, a capacitor array includes a unit capacitor (Cu) structure characterized by a unit capacitance value, a plurality of different super-unit capacitor structures, each different super-unit capacitor structures having a different capacitance defined by a multiple of the unit capacitance value, and a plurality of different sub-unit capacitor (sub-Cu) structures, each different sub-unit capacitor structure having a different capacitance defined by a division of the unit capacitance value. The multiples and divisions may be integer-based. For example, each different super-unit capacitor structure may have a different capacitance defined by a multiple of the unit capacitance value corresponding to $2^m$, where (m) is an integer value from 1 to a maximum multiplication (m_max) that corresponds to a most significant bit (MSB) of the capacitor array. Similarly, each different sub-unit capacitor structure may have a different capacitance defined by a division of the unit capacitance value corresponding to $1/(2^n)$, where (n) is an integer value from 1 to a maximum subdivision (n_max) that corresponds to a least significant bit (LSB) of the capacitor array.

In accordance with embodiments, error mitigation techniques are utilized to more readily downsize and systematically match errors of small capacitances associated with the sub-unit capacitors. Utilizing techniques disclosed herein sub-unit capacitor with capacitance values of ¼Cu, ⅛Cu, and smaller, such as ¹⁄₁₆Cu are possible.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

Referring now to FIG. 1 a block diagram is provided of an analog-to-digital converter (ADC) in accordance with embodiments. ADC 100 is an embodiment of an SAR ADC which may be included in a system on chip (SoC) device. ADC 100 includes SAR control unit 101, digital-to-analog converter (DAC) 103, and comparator circuit 105. ADC 100 receives input signal 110 to be measured, reference signal 112, and communicates with other portions of the SoC via system bus 114.

SAR control unit 101 may correspond to a state machine or other suitable processing unit designed to adjust and route signals to DAC 103 and comparator 105 in order to determine a digital value corresponding to a voltage level of an input signal. In operation, SAR control unit 101 may receive a command via system bus 114 to begin a measurement of the voltage level of input signal 110. In response to receiving the command, SAR control unit adjusts switches in DAC 103 to couple input signal 110 to a first terminal of each of a plurality of capacitors 107 within DAC 103 and adjust switches to couple a second terminal of each of capacitors 107 to a ground signal. Each of capacitors 107 will begin charging and SAR control unit 101 allows the various capacitors to charge to a voltage level equal to the voltage level of input signal 110, at which point SAR control unit 101 decouples the first terminal from input signal 110. This process is sometimes referred to as "sampling the input."

DAC 103 is implemented as a capacitive DAC, i.e., an array of capacitors are used rather than an array of resistors such as used in resistive DACs. DAC 103 may receive a series of digital signals from SAR control unit 101 and, in response, output a corresponding voltage level. DAC 103 includes capacitors 107 and a plurality of switches that enable the first terminal of each of capacitors 107 to be independently coupled to either input signal 110 or reference signal 112. Capacitors 107 may be designed such that the capacitors have capacitance values that are subdivisions of one another. For example, the capacitor array may be arranged based on a unit capacitor (Cu), and a plurality of divisions thereof as sub-unit capacitor (e.g. ½C, ¼C, ⅛C, ¹⁄₁₆C, etc.), and groups of unit capacitors as larger capacitors (e.g. 2C, 4C, 8C, 16C, etc.). The smallest sub-unit capacitor value may correspond to the least significant bit (LSB) capacitor, and the largest group of unit capacitors may correspond to the most significant bit (MSB) capacitor. In accordance with some embodiments, the capacitor array is arranged in a manner to achieve an overall compact array size.

Once input signal 110 has been sampled, then SAR control unit 101 couples the first terminal of the first capacitor to reference signal 112, then couples the second terminal of each of the plurality of capacitors to a first input of comparator circuit 105. An output of the comparator corresponds to the MSB of a value corresponding to the voltage level of input signal 110. SAR control circuit 101 decouples the second terminal of the capacitors from comparator circuit 105 and then couples the first terminal of the second capacitor to reference signal 112 and then again couples the second terminal of each capacitor to the first input of comparator circuit 105. The updated output of the comparator corresponds to the second MSB of the value corresponding to the voltage level of input signal 110. This process repeats until all bits of the value corresponding to the voltage level of input signal 110 have been determined. In various embodiments, the result may be stored in a register within SAR control unit 101 or may be output onto system bus 114.

A total number of capacitors required for DAC 103 is dependent upon a resolution of ADC 100, i.e., a number of bits of the value representing the voltage of input signal 110 (i.e., the result). At least one capacitor is needed for each bit. In some embodiments, additional capacitors may be required for sampling input signal 110, for stabilizing or adjusting reference signal 112, for general noise reduction, etc. Accuracy for ADC 100 is dependent on the relative capacitance values of each capacitor for each bit of the result.

It is noted that ADC 100 of FIG. 1 is merely an example for demonstration of disclosed concepts. Some functional components and some operational details have been omitted to focus on the disclosed subject matter. In other embodiments, additional functional units may be included and operation may deviate from the description above.

Figure 2:
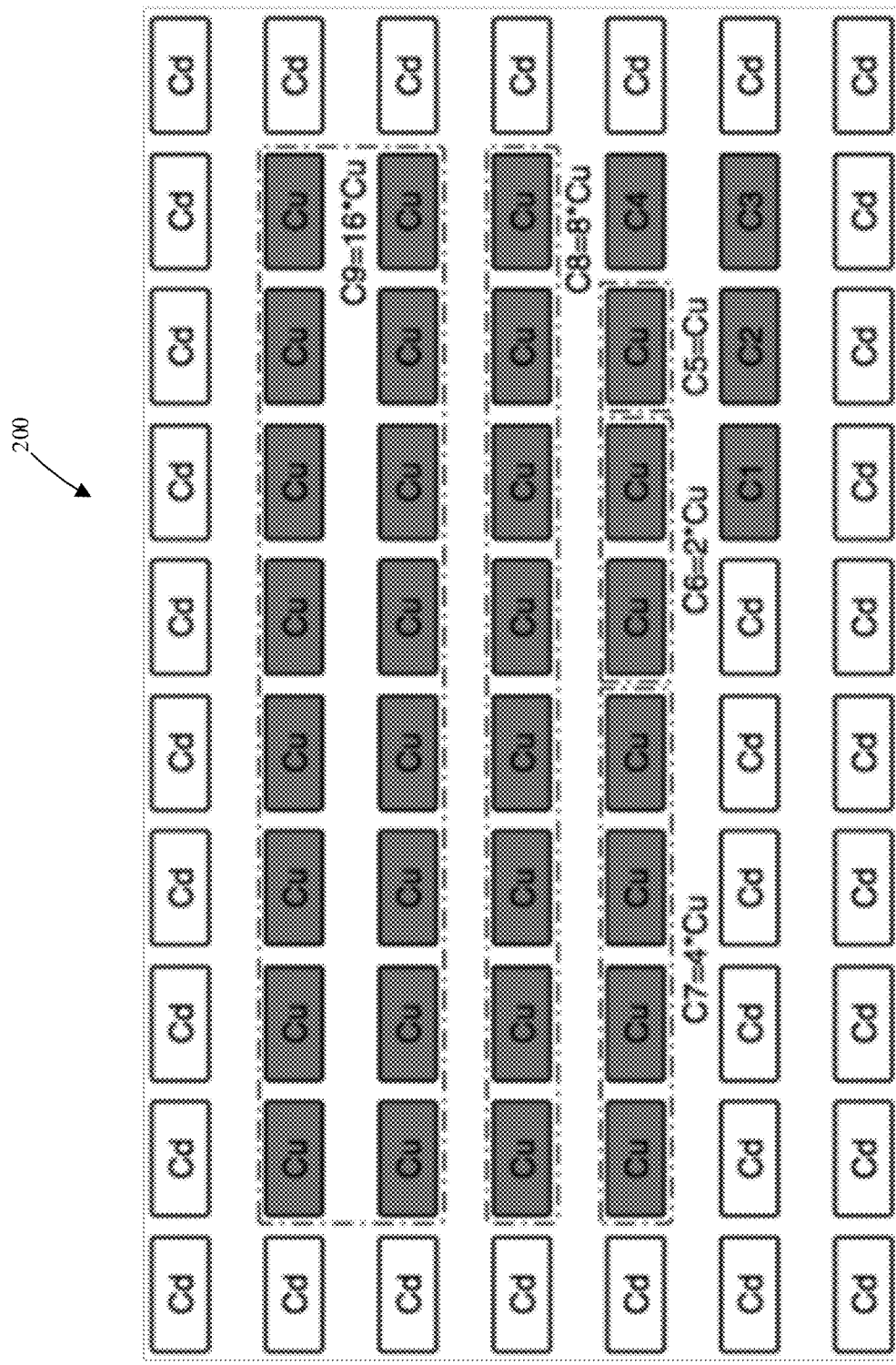
FIG. 2 is a layout view of a capacitor array in accordance with and embodiment.

FIG. 2 is a layout view of a capacitor array in accordance with and embodiment. Depending on the physical resolution and total capacitance of the array needed (e.g. illustrated is an exemplary 9-bit binary DAC array with a total value of 100 fF), the value of the optimum unit capacitor Cu (that repeats the most in the array) may be decided to achieve an overall compact array size. The array size can directly impact power of the applications. Since there is overhead (metal not used to form capacitance) for each Cu, the area of the capacitance needed does not proportionally scale with the capacitance needed. For example, the area of a 0.2 fF capacitor can be similar to that of 0.4 fF capacitor. Minimizing the number of Cu is a significant factor to achieve compactness. For example, if Cu=100 fF/2^9=0.2 fF, 2^9 Cu are needed and the array size can be big. The weight of each bit in the example array shown in FIG. 2 is 16*Cu (the most significant bit, MSB), 8*Cu, 4*Cu, 2*Cu, Cu, ½*Cu, ¼*Cu, ⅛*Cu, ¹⁄₁₆*Cu (the least significant bit, LSB), and only 35 times of the area of Cu is needed, compared to 2^9=512 in a traditional case. Cd indicates possible dummies for matching purpose. The ability of accurately dividing down the capacitor value based on a unit capacitor structure Cu is key to achieving a compact array. An optimum Cu therefore exists.

As generally illustrated in FIG. 2, the total areas for a sub-unit capacitor structure (C1-C4) and unit capacitor structure (C5) may remain substantially the same for a variety of reasons, such as area required for terminal contact, stress-matching, ease of manufacture, etc. However, the metal lines and via distribution between metal layers may have different layouts and connections to create different "primary capacitors" and "secondary capacitors" within the sub-unit capacitor structures.

Figure 3:
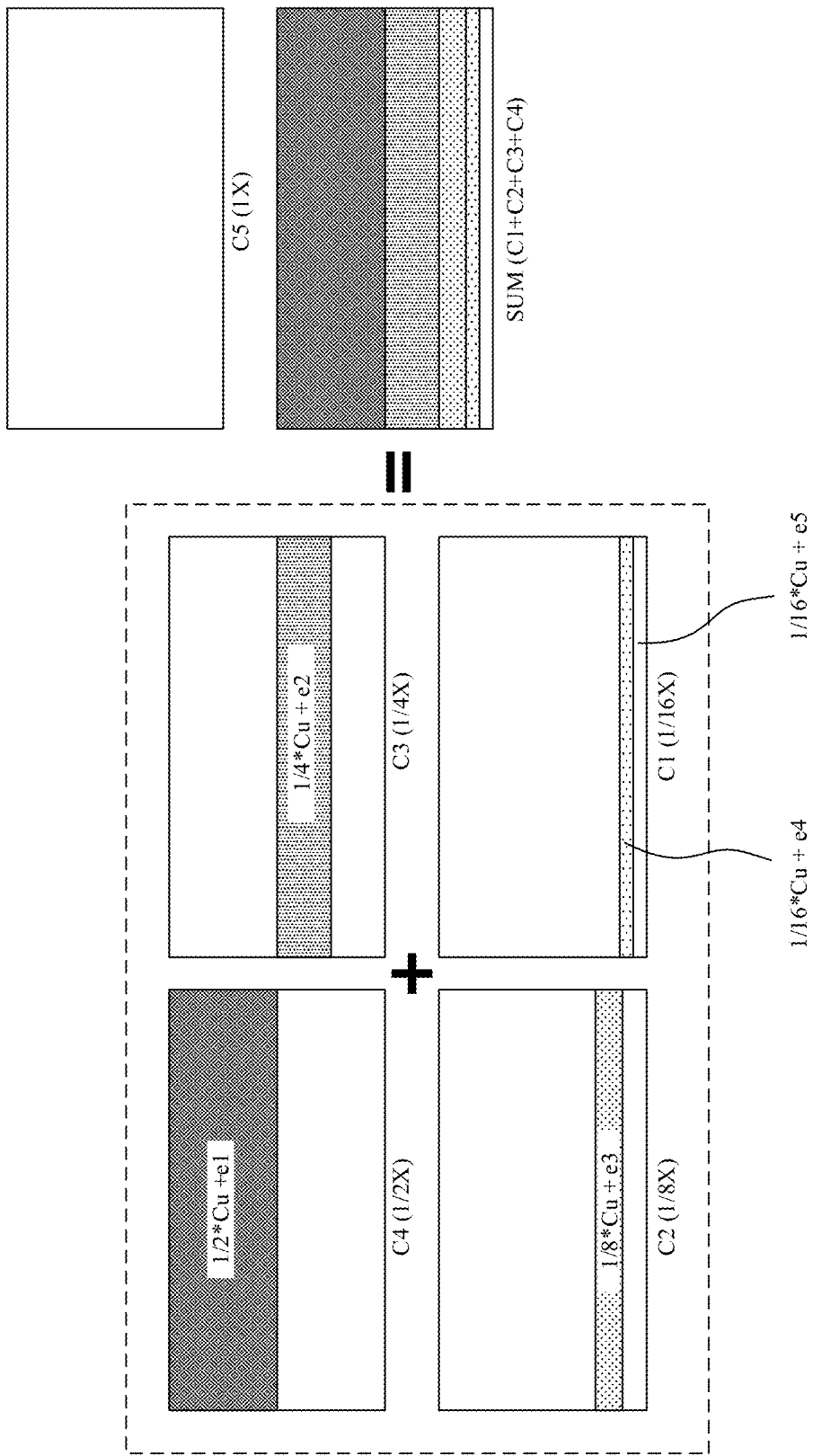
FIG. 3 is a graphical illustration of correlated error within sub-unit capacitors in accordance with embodiments.

FIG. 3 shows sub-unit capacitor structure (C4, C3, C2, C1 shown in FIG. 2) implementations and "primary capacitor" area allocation (darkest shading) to form each sub-unit capacitor structure. The capacitance for each sub-unit capacitor structure is proportional to the "primary capacitor" area and correlated error. Total capacitance is matched with use of secondary capacitors. As shown, total capacitance is shown by $1/n*Cu+en$, where n represents the magnitude of the subdivision. The errors e1-e5 are correlated errors. Correlated errors are the equal amount of capacitance errors found in the same area/location of the unit capacitors (1X) and sub-unit capacitors (½X, ... 1/16X) across the array, due to some system mismatches in the capacitor array manufacture process. As shown in FIG. 3, the sum value of four sub-unit capacitors (½X, ¼X, ⅛X, 1/16X) is equivalent to the capacitance formed by the shaded area in another virtual capacitor named "SUM", because of the correlation. Random mismatch (uncorrelated) is not considered here. The difference between the virtual capacitor "SUM" and the capacitor "1X" is the colorless part in "SUM", which minus an ideal value of 1/16*Cu is the DNL error. Correlated errors in shaded area in the capacitor "SUM" do not accumulate to worsen the DNL, only the capacitance change in the colorless part contributes to the DNL transition, thus minimizing the DNL from the transition mentioned above. The principle illustrated in FIG. 3 may be understood as shown the partitioning of the horizontal metal lines (e.g. M0, M2) in a capacitor, for example, in metal layers 0, 2, etc. as described in more detail with regard to FIGS. 8A-8F. The principle also applies to allocate vertical metal lines (e.g. M1) used to for the capacitors, such as in metal layer 1, etc.

In an embodiment, each of the Cu structure, the plurality of different sub-unit capacitor structures (e.g. C1, C2, C3, C4 in FIG. 2), and the plurality of different super-unit capacitor structures (e.g. C6, C7, C8, C9 in FIG. 2) includes a same array of metal layers (e.g. 0, 1, 2, etc.), each array of metal layers including a lower metal layer (e.g. 0) including first and second non-overlapping lower halves, and an upper metal layer (e.g. 1) orthogonal to the lower metal layer including first and second non-overlapping upper halves. Additional metal layers may be included, though the following description focuses on two to three metal layers for simplicity and ease of illustration.

As described in more detail in the following description, the capacitor array may include a Cu structure terminal coupled with a plurality of metal lines substantially distributed among first and second non-overlapping lower halves (e.g. 802, 804, FIG. 8A) and among first and second non-overlapping upper halves (e.g. 812, 814, FIG. 8A) of the Cu structure. A ½ sub-unit capacitor structure (e.g. C4) with capacitance value of ½ the unit capacitance may have a ½ sub-unit capacitor structure terminal coupled with a plurality of metal lines substantially distributed among only the first lower half, and the first upper half of the ½ sub-unit capacitor structure. See, for example, the ½*Cu capacitor in FIG. 3 (only first and second non-overlapping halves of lower metal layer such as 0 are illustrated).

A ¼ sub-unit capacitor structure with capacitance value of ¼ the unit capacitance may have a ¼ sub-unit capacitor structure terminal coupled with a plurality of metal lines substantially distributed among only the second lower half and the second upper half of the ¼ sub-unit capacitor structure. See, for example, the ¼*Cu capacitor in FIG. 3, where the shaded area does not overlap the shaded area of the ½*Cu capacitor in FIG. 3.

A ⅛ sub-unit capacitor structure with capacitance value of ⅛ the unit capacitance may have a ⅛ sub-unit capacitor structure terminal coupled with a plurality of metal lines substantially distributed among only the second lower half and the second upper half of the ⅛ sub-unit capacitor structure. See, for example, the ⅛*Cu capacitor in FIG. 3, where the shaded area does not overlap the shaded area of the ½*Cu capacitor in FIG. 3, or the shaded area of the ¼*Cu capacitor in FIG. 3.

DNL describes the deviation between two analog values corresponding to adjacent input digital values. $DNL(i) = \{Vout(i) - Vout(i-1) - LSB\}/LSB$, wherein (i) is a digital input value. In conventional capacitor arrays the more bits or capacitors that are involved in the switching in the transition, the more DNL error will be produced. Since correlated errors exist inside the unit capacitor Cu, the biggest DNL error normally comes from the transition of x01111 to x10000 shown in FIGS. 4-5.

Figure 4:
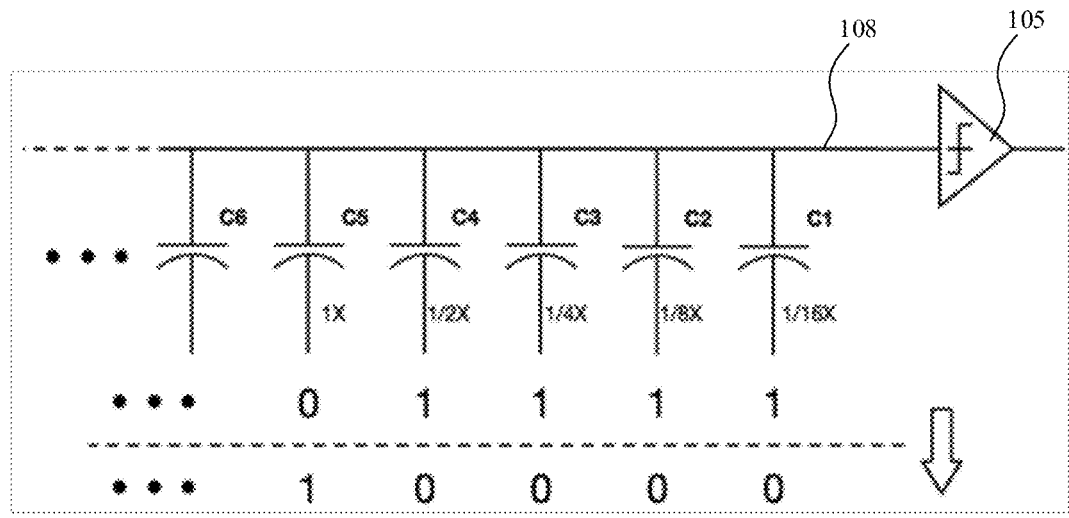
FIG. 4 is a schematic illustration of assigned bits to sub-unit capacitors for a x011111 to x10000 transition accordance with an embodiment.
Figure 5:
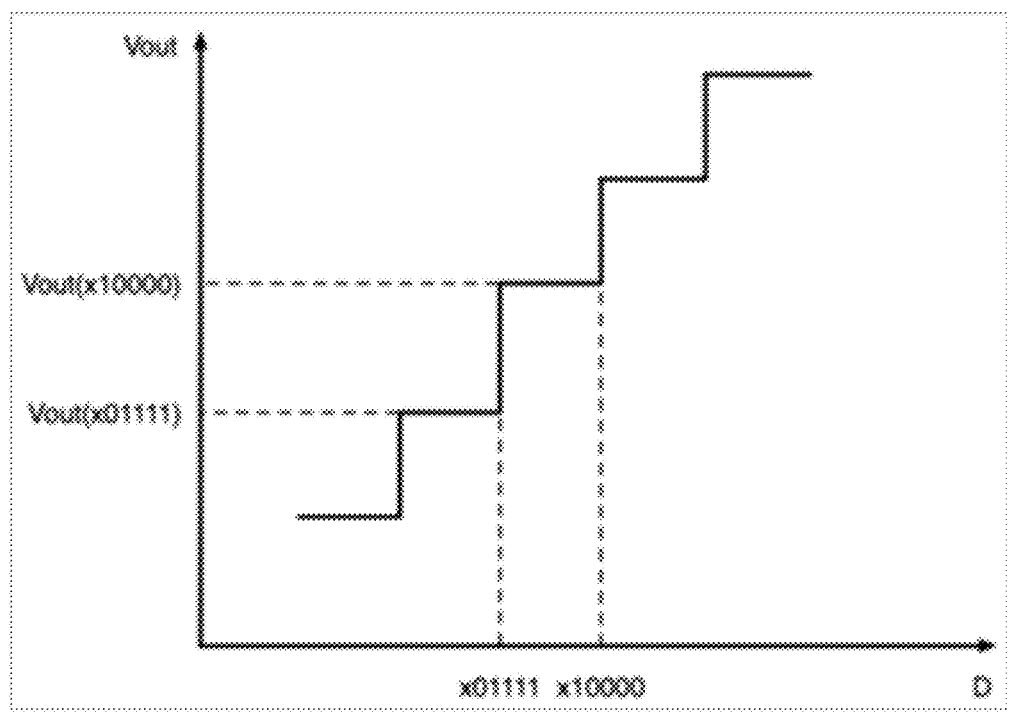
FIG. 5 is a plot illustrating the relationship of differential nonlinearity between two analog values for a x011111 to x10000 transition in accordance with an embodiment.

FIG. 4 is a schematic illustration illustrating the assignment of bits to sub-unit capacitors for a x011111 to x10000 transition, and FIG. 5 is a plot illustrating the relationship of DNL between two analog values for the x011111 to x10000 transition in accordance with an embodiment.

In the exemplary embodiments illustrated in FIGS. 2-5, the actual capacitance value of unit capacitor Cu with correlated errors is $Cu+e1+e2+e3+e4+e5$. DNL error from correlated errors at the transition (x01111 to x10000) is calculated with equation (1):

$$\frac{(Cu + e1 + e2 + e3 + e4 + e5) - (1/2*Cu + e1 + 1/4*Cu + e2 + 1/8*Cu + e3 + 1/16*cu + e4) - LSB}{LSB} = \frac{e5}{LSB} \quad (1)$$

In the particular embodiment illustrated the LSB=1/16*Cu. The DNL error is limited to e5 (shown in FIG. 3) from a small area (1/16X)Cu, instead of accumulation of multiple correlated errors if the same area/location were chosen to form different sub-unit capacitors. DNL of the array from correlated errors may be greatly mitigated in such an embodiment.

Metal-on-metal (MOM) capacitor structures in accordance with embodiments may be compatible with technology nodes featuring multiple patterning, and be been designed in a way that DNL of the array from correlated errors can be mitigated. Systematic mismatch (due to second-order effects) between the unit capacitor Cu and the sub-unit capacitors with fractional values may be precisely accounted for.

Figure 6:
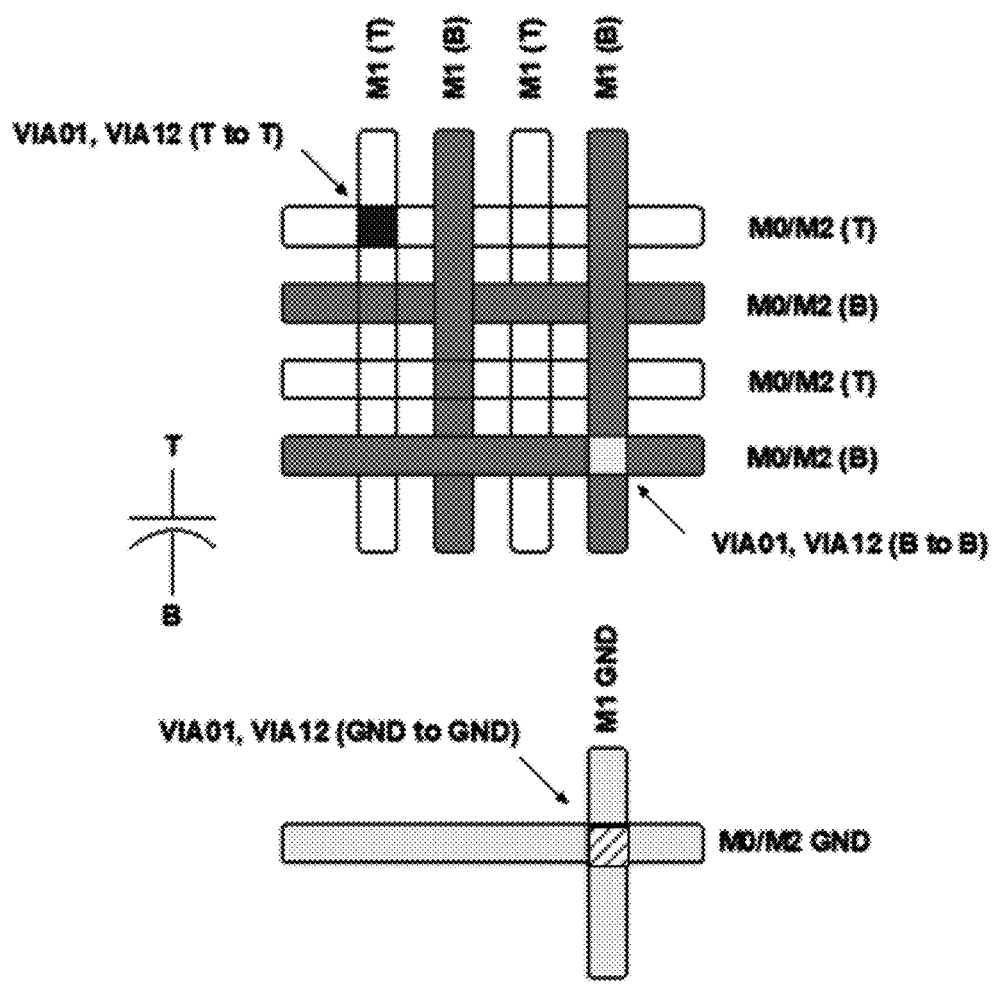
FIG. 6 is a layout view of three metal layers within a capacitor structure in accordance with an embodiment showing terminologies used.
Figure 7:
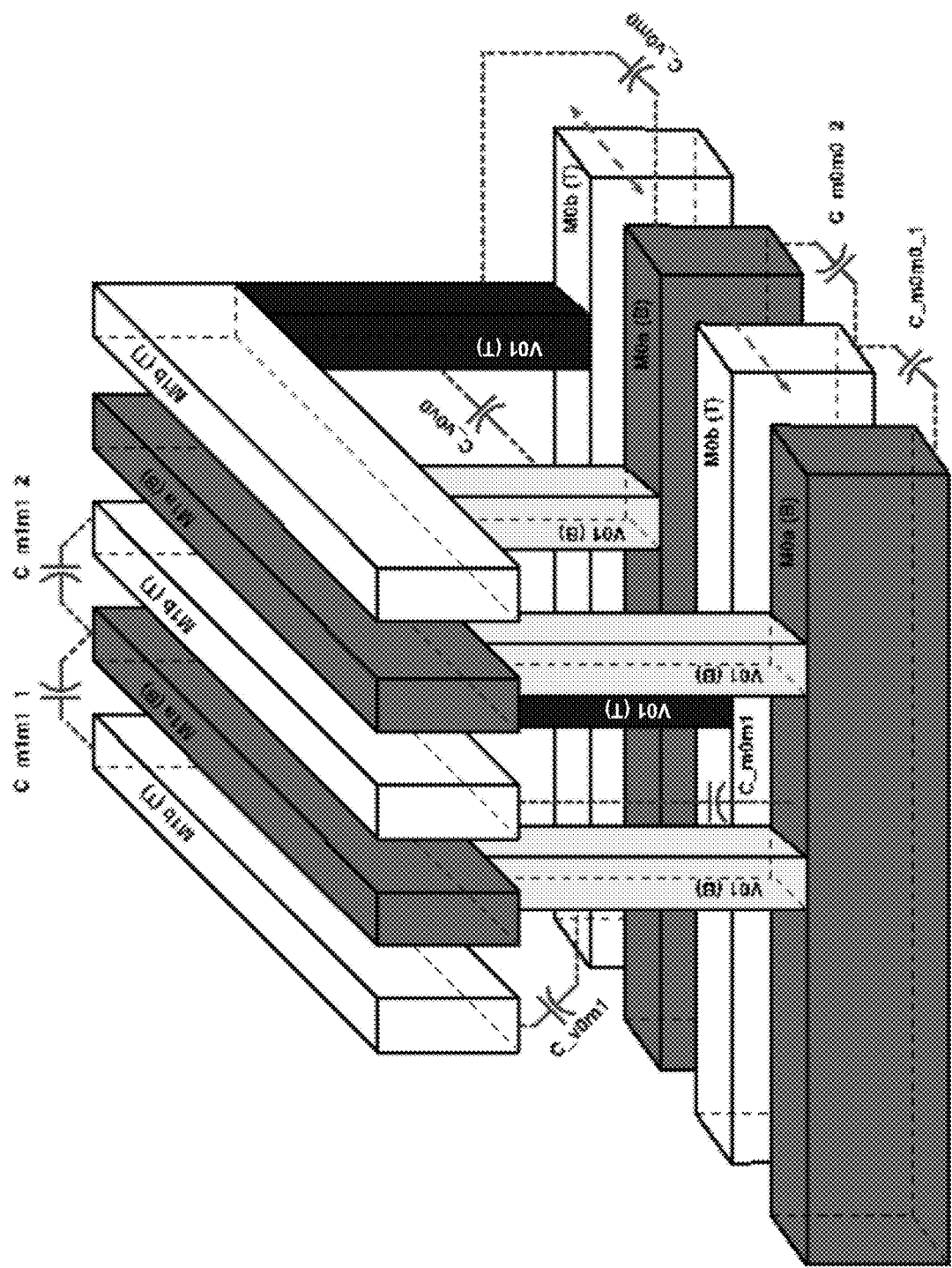
FIG. 7 is a perspective view of two connected metal layers and vias within a capacitor structure in accordance with an embodiment showing terminologies used.

FIG. 6 is a layout view of three metal layers (e.g. M0/M1/M2) within a capacitor structure in accordance with an embodiment to show the terminologies used. M0/M1/M2 are metal lines in metal layers 0/1/2 and (T/B) indicates top-plate (colorless)/bottom-plate (shaded) terminals of the capacitor structure. In an embodiment, the shaded metal lines are coupled with a terminal B (e.g. bottom plate), that may be electrically connected with a digital logic bit node 106 to the SAR control 101 (FIG. 1). Similarly, the colorless metal lines may be coupled with a terminal T (e.g. top plate), that may be electrically connected with a floating node 108 to the comparator 105 input (FIG. 1). VIA01 connects M0 and M1 and VIA12 connects M1 and M2. Dark/light shaded vias are for top-plate/bottom plate terminals (T/B). Dark shaded vias are for grounds (shields, T to T) and diagonally filled vias are for ground to ground (GND to GND) connection. FIG. 7 shows the capacitor definitions in a perspective view. Only two metal layers are shown for visibility and simplicity. C_m0m0_1 is the capacitor between two adjacent metal lines M0b (T) and M0a (B) on metal layer 0, C_m0m0_2 is the capacitor between two adjacent metal lines M0b (T) and M0a (B) (on the other side) on metal layer 0. C_m0m0_1 and C_m0m0_2 ideally are identical, if all metal lines on layer 0 are identical and equally spaced. However, in technology with multiple patterning (double patterning shown here), metal lines M0a (shaded) and M0b (colorless) are fabricated in two phases. Due to the possible misalignment of the two phases, M0b lines may shift up or down (dashed arrows), referring to M0a lines. Depending on the nature of the misalignment, there will be systematic or random mismatches between C_m0m0_1 and C_m0m0_2. Same definitions hold true for C_m1m1_1 and C_m1m1_2. These capacitors are primary capacitors formed by MOM capacitor structure. Secondary effect capacitors, such as inter-layer capacitor (e.g. C_m0m1 formed by orthogonal metal lines M0a(B) and M1b(T)), via to via capacitor (e.g. C_v0v0 formed by V01(B) & V01(T)), and via to line capacitor (e.g. C_v0m1 and C_v0m0), are commonly neglected, yet can play an important role for matching fractional capacitance values in accordance with embodiments.

FIGS. 8A-8F show the a unit capacitor and a plurality of fractional sub-unit capacitors in a capacitor array in accordance with embodiments. FIG. 8A marked by "1X" is the unit capacitor structure (Cu) with a capacitance value of Cu. FIG. 8B marked by "½X" has a capacitance value of ½*Cu. Similar rules apply to remaining sub-figures marked by "¼X", "⅛X", and "1/16X". The systematic errors of the ratios between X, ½X, ¼X, . . . 1/16X can be kept extremely low by carefully dealing with secondary effects. Instead of being removed, secondary effect capacitors (bold fonts in the first column in Table 1) are proportionally matched in Cu and its fractional values. Table 1 below shows the values of capacitors in the array. Table 1 assumes 20% mismatch between capacitors C_m0m0_1 and C_m0m0_2, C_m2m2_1 and C_m2m2_2, C_m1m1_1 and C_m1m1_2, due to double patterning. The errors Error1 and Error2 are very small (~30 aF).

Referring now to FIG. 2 in combination with FIGS. 8A-8F, in an embodiment a capacitor array 200 includes a unit capacitor (Cu) structure characterized by a unit capacitance value (1X), a plurality of different super-unit capacitor structures (e.g. C6, C7, C8, C9), each different super-unit capacitor structures having a different capacitance (e.g. 2X, 4X, 8X, 16X) defined by a multiplication of the unit capacitance value, and a plurality of different sub-unit capacitor structures (e.g. C1, C2, C3, C4), each different sub-unit capacitor structure having a different capacitance (e.g. ½X, ¼X, ⅛X, 1/16X) defined by a division of the unit capacitance value. In accordance with embodiments, each of the Cu structure, the plurality of different sub-unit capacitor structures, and the plurality of different super-unit capacitor structures includes a same array of metal layers (0, 1, 2), each array of metal layers including a lower metal layer (e.g. 0) including first and second non-overlapping lower halves, and an upper metal layer (e.g. 1) orthogonal to the lower metal layer including first and second non-overlapping upper halves.

In an embodiment illustrated in FIG. 8A, a Cu structure terminal (B) may be coupled with a plurality of metal lines (M0, M1, M2) substantially distributed among the first and second non-overlapping lower halves (802, 804) and upper halves (812, 814) of the Cu structure.

As shown in FIG. 8B, the capacitor array may further include a ½ sub-unit capacitor structure with capacitance value of ½ the unit capacitance that has a ½ sub-unit capacitor structure terminal (B) coupled with a plurality of metal lines substantially distributed among only the first lower half 802 (metal lines M0, M2), and the first upper half 812 (metal lines M1) of the ½ sub-unit capacitor structure.

As shown in FIG. 8C, the capacitor array may further include a ¼ sub-unit capacitor structure with capacitance value of ¼ the unit capacitance that has a ¼ sub-unit capacitor structure terminal (B) coupled with a plurality of metal lines substantially distributed among only the second lower half 804 (metal lines M0, M2) and the second upper half 814 (metal lines M1) of the ¼ sub-unit capacitor structure.

As shown in FIG. 8D, the capacitor array may further include a ⅛ sub-unit capacitor structure with capacitance value of ⅛ the unit capacitance that has a ⅛ sub-unit capacitor structure terminal (B) coupled with a plurality of metal lines substantially distributed among only the second lower half 804 (metal lines M0, M2) and the second upper half 814 (metal lines M1) of the ⅛ sub-unit capacitor structure.

Similar arrangements are shown in FIGS. 8E and 8F for 1/16 sub-unit capacitor structures with capacitance value

TABLE 1

Capacitor values in the capacitor array

| Cap Type | 1X | 1/2X | 1/4X | 1/8X | 1/16X |
|---|---|---|---|---|---|
| M0-M0 | 4*C_m0m0_1 + 4*C_m0m0_2 | 2*C_m0m0_1 + 2*C_m0m0_2 | 1*C_m0m0_1 + 1*C_m0m0_2 | 1*C_m0m0_1 | 1*C_m0m0_2 |
| M2-M2 | 4*C_m2m2_1 + 4*C_m2m2_2 | 2*C_m2m2_1 + 2*C_m2m2_2 | 1*C_m2m2_1 + 1*C_m2m2_2 | 1*C_m2m2_1 | 0 |
| M1-M1 | 8*C_m1m1_1 + 8*C_m1m1_2 | 4*C_m1m1_1 + 4*C_m1m1_2 | 2*C_m1m1_1 + 2*C_m1m1_2 | 1*C_m1m1_1 + 1*C_m1m1_2 | 1*C_m1m1_1 |
| M0-M1 | 76*C_m0m1 | 38*C_m0m1 | 19*C_m0m1 | 10*C_m0m1 | 5*C_m0m1 |
| M1-M2 | 76*C_m1m2 | 38*C_m1m2 | 19*C_m1m2 | 10*C_m1m2 | 4*C_m1m2 |
| V01-V01 | 16*C_v0v0 | 8*C_v0v0 | 4*C_v0v0 | 2*C_v0v0 | 0 |
| V12-V12 | 16*C_v1v1 | 8*C_v1v1 | 4*C_v1v1 | 2*C_v1v1 | 0 |
| Total Cap | Cu | Cu/2 | Cu/4 | Cu/8 + Error1 | Cu/16 + Error2 |

In one aspect, the capacitor arrays in accordance with embodiments may be utilized to achieve a compact array size while maintaining fractional matching of the capacitors. The ability to accurately divide down the capacitance values based on a unit capacitor utilizing secondary effect capacitors facilitates achieving a compact array. The systematic errors of the ratios between X, ½X, ¼X, . . . 1/16X, etc. may be kept extremely low by carefully dealing with secondary effects. Instead of being removed, secondary effects are proportionally matched in Cu and its fractional values. In addition, sets of non-overlapped different locations in a unit capacitor are chosen to form the set of fractional capacitor values. DNL error from the transition of sum of all fractional capacitor values to a unit capacitor value can be minimized utilizing such a configuration.

of ⅟₁₆ the unit capacitance. Note the capacitor structure of FIG. 8E includes metal lines M0/M1 connected to the capacitor structure terminal (B), whereas the capacitor structure of FIG. 8F includes metal lines M1/M2 connected to the capacitor structure terminal (B). Thus, separate metal layers are illustrated for the exemplary LSB capacitor (FIG. 8E) and the unused unit capacitor area (FIG. 8F).

The capacitor array may include super-unit capacitor structures, and sub-unit capacitor structures with integer-based multiples and divisions of the unit capacitor structure Cu. In an embodiment, a capacitor array includes a unit capacitor structure (Cu) characterized by a unit capacitance value (1X), and a plurality of different sub-unit capacitor structures (e.g. C1, C2, C3, C4), each different sub-unit capacitor structure having a different capacitance (e.g. ½X, ¼X, ⅛X, ⅟₁₆X) defined by a division of the unit capacitance value corresponding to $1/(2^n)$, wherein (n) is an integer value from 1 to a maximum subdivision (n_max) that corresponds to a least significant bit (LSB) of the capacitor array, and n_max≥2. In an embodiment, n_max≥3.

In an embodiment a method of operating a digital to analog converter 103 includes receiving a digital input signal, and assigning separate bits to a plurality of capacitors 107 in a capacitor array 200. In accordance with embodiments, assigning a bit to a capacitor 107 includes selecting a capacitor that is assigned a total capacitance value, such as that provided in Table 1, that is a combination of primary intra-layer capacitors formed by parallel metal lines, and secondary effect capacitors. For example, the secondary effect capacitors can be are selected from any or all of inter-layers capacitors formed by orthogonal metal lines, secondary effect via-to-via capacitors formed by adjacent metal vias, and secondary effect via-to-line capacitors formed between vias and adjacent metal lines unconnected to the corresponding vias.

In an embodiment a method of operating a digital to analog converter 103 includes receiving a digital input signal, assigning separate bits to a unit capacitor Cu and a plurality of different sub-unit capacitors (e.g. C1-C4) in a capacitor array 200 with correlated capacitance error. Each different sub-unit capacitor structure may have a different capacitance defined by a division of the unit capacitance value corresponding to $1/(2^n)$, wherein (n) is an integer value from 1 to a maximum subdivision (n_max) that corresponds to a least significant bit (LSB) of the capacitor array. In an embodiment, n_max≥2.

The unit capacitor Cu may have an error of $e_0*Cu$, and each subunit capacitor have an error of $e_n*Cu*1/(2^n)$, n=1,2, . . . n_max. Furthermore, referring to FIG. 3 and FIG. 8F an unused area of the unit capacitor for constructing each of the different sub-unit capacitor structures has a capacitance value of $Cu/(2^{n\_max})$ and an error of $e_u*Cu/(2^{n\_max})$.

In accordance with an embodiment, a sum of error for the plurality of different sub unit capacitors ($e_{sub\_sum}$) is defined by equation 2:

$$e_{sub\_sum} = \sum_{n=1}^{n\_max} e_n * Cu/(2^n) \qquad (2)$$

In an embodiment, a differential non-linearity (DNL) value between the unit capacitor Cu and a sum of the plurality of sub-unit capacitors is equal to the result of equation 3:

$$(e_0*Cu)-(e_{sub\_sum}*Cu)=e_u*Cu/(2^{n\_max}). \qquad (3)$$

Thus, the DNL (the difference of a real value from the actual value) is approximately the error of the unused area of the unit capacitor for constructing each of the different sub-unit capacitor structures. In the particular embodiment illustrated in FIG. 8F, it is noted this area overlaps the area of the LSB sub-unit capacitor of FIG. 8E, though is characterized by unused metal lines in the metal layers includes M1/M2 metal lines as opposed to the M0/M1 metal lines.

In utilizing the various aspects of the embodiments, it would become apparent to one skilled in the art that combinations or variations of the above embodiments are possible for forming metal-on-metal capacitor array structures with correlated error mitigation. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A capacitor array comprising:
a same array of metal layers spanning across a group of capacitor structures such that each capacitor structure in the group of capacitors includes the array of metal layers, and the group of capacitor structures includes a unit capacitor (Cu) structure characterized by a unit capacitance value, a plurality of different super-unit capacitor structures, and a plurality of different sub-unit capacitor structures;
wherein each of the different super-unit capacitor structures has a different capacitance defined by a multiplication of the unit capacitance value, and each of the different sub-unit capacitor structures has a different capacitance defined by a division of the unit capacitance value; and
wherein each capacitor structure of the group of capacitor structures includes:
a plurality of lower metal lines including a first half of lower metal lines in a first lower half of the capacitor structure and a second half of lower metal lines in a second lower half of the capacitor structure that does not overlap the first half of the capacitor structure;
a plurality of upper metal lines including a first half of upper metal lines in a first upper half of the capacitor structure and a second half of upper metal lines in a second upper half of the capacitor structure that does not overlap the first half of upper of the capacitor structure, the plurality of upper metal lines orthogonal to the plurality of lower metal lines.

2. The capacitor array of claim 1, comprising a Cu structure terminal coupled with the first half of lower metal lines and the second half of lower metal lines and the first half of upper metal lines and the second half of upper metal lines.

3. The capacitor array of claim 2, wherein the Cu structure includes a first group of vias located in the first lower half, the first upper half, and the second upper half of the capacitor structure to electrically connect the first half of lower metal lines and the first half of upper metal lines of the Cu structure.

4. The capacitor array of claim 2, wherein the plurality of different sub-unit capacitor structures includes a ½ sub-unit capacitor structure with a capacitance value of ½ a unit capacitance of the Cu structure.

5. The capacitor array of claim 4, wherein the ½ sub-unit capacitor structure includes a ½ sub-unit capacitor structure terminal coupled with a second group of metal lines substantially distributed among only the first half of lower metal lines and the first half of upper metal lines of the ½ sub-unit capacitor structure.

6. The capacitor array of claim 5, wherein the ½ sub-unit capacitor structure includes a second group of vias located in the first lower half and the first upper half of the capacitor structure to electrically connect the second group of metal lines substantially distributed among only the first half of lower metal lines and the first half of upper metal lines of the ½ sub-unit capacitor structure.

7. The capacitor array of claim 5, wherein the plurality of different sub-unit capacitor structures includes ¼ sub-unit capacitor structure with a capacitance value of ¼ the unit capacitance of the Cu structure.

8. The capacitor array of claim 7, wherein the ¼ sub-unit capacitor structure includes a ¼ sub-unit capacitor structure terminal coupled with a third group of metal lines substantially distributed among only the second half of lower metal lines and the second half of upper metal lines of the ¼ sub-unit capacitor structure.

9. The capacitor array of claim 8, wherein the ¼ sub-unit capacitor structure includes a third group of vias located in the second lower half and the second upper half of the capacitor structure to electrically connect the third group of metal lines substantially distributed among only the second half of lower metal lines and the second half of upper metal lines of the ½ sub-unit capacitor structure.

10. The capacitor array of claim 9, wherein the plurality of different sub-unit capacitor structures includes ⅛ sub-unit capacitor structure with a capacitance value of ⅛ the unit capacitance of the Cu structure.

11. The capacitor array of claim 10, wherein the ⅛ sub-unit capacitor structure includes a ⅛ sub-unit capacitor structure terminal coupled with a fourth group of metal lines substantially distributed among only the second half of lower metal lines and the second half of upper metal lines of the ⅛ sub-unit capacitor structure.

12. The capacitor array of claim 11, wherein the ⅛ sub-unit capacitor structure includes one or more fourth vias located in the second lower half and the second upper half of the capacitor structure to electrically connect the fourth group of metal lines substantially distributed among only the second half of lower metal lines and the second half of upper metal lines of the ⅛ sub-unit capacitor structure.

13. The capacitor array of claim 1, wherein each different sub-unit capacitor structure has a different capacitance defined by a division of the unit capacitance value corresponding to $1/(2^n)$, wherein (n) is an integer value from 1 to a maximum subdivision (n_max) that corresponds to a least significant bit (LSB) of the capacitor array.

14. The capacitor array of claim 13, wherein each different super-unit capacitor structure has a different capacitance defined by a multiplication of the unit capacitance value corresponding to $2^m$, wherein (m) is an integer value from 1 to a maximum multiplication (m_max) that corresponds to a most significant bit (MSB) of the capacitor array.

15. The capacitor array of claim 14, wherein n_max≥2.

* * * * *